(12) United States Patent
Takata et al.

(10) Patent No.: US 7,595,791 B2
(45) Date of Patent: Sep. 29, 2009

(54) INPUT DEVICE

(75) Inventors: Masahiro Takata, Fukushima-ken (JP); Kunio Sato, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 655 days.

(21) Appl. No.: 11/372,502

(22) Filed: Mar. 10, 2006

(65) Prior Publication Data

US 2006/0250354 A1    Nov. 9, 2006

(30) Foreign Application Priority Data

Mar. 17, 2005 (JP) ............................. 2005-077623

(51) Int. Cl.
*G06F 3/044* (2006.01)
(52) U.S. Cl. ..................... 345/174; 178/18.06
(58) Field of Classification Search .................. 345/173, 345/174
See application file for complete search history.

(56) References Cited

U.S. PATENT DOCUMENTS

| | | | |
|---|---|---|---|
| 4,376,879 A * | 3/1983 | Nagata et al. ............... 200/314 |
| 6,310,609 B1 * | 10/2001 | Morgenthaler ............... 345/170 |
| 6,664,951 B1 * | 12/2003 | Fujii et al. ................... 345/173 |
| 6,781,654 B2 * | 8/2004 | Kim et al. .................... 349/122 |
| 7,394,451 B1 * | 7/2008 | Patten et al. ................. 345/156 |
| 2001/0037933 A1 * | 11/2001 | Hunter et al. ................ 200/310 |
| 2003/0122794 A1 * | 7/2003 | Caldwell ..................... 345/173 |
| 2004/0144633 A1 * | 7/2004 | Gordon et al. .............. 200/308 |
| 2004/0145538 A1 * | 7/2004 | Uchida et al. .................. 345/6 |
| 2004/0248621 A1 * | 12/2004 | Schon ......................... 455/566 |
| 2005/0030048 A1 * | 2/2005 | Bolender et al. ............ 324/661 |
| 2005/0098417 A1 * | 5/2005 | Miyako et al. ........... 200/61.54 |
| 2006/0109258 A1 * | 5/2006 | Takisawa .................... 345/173 |

FOREIGN PATENT DOCUMENTS

| JP | 2003-308752 | 10/2003 |
|---|---|---|
| JP | 2004-201175 | 7/2004 |

* cited by examiner

*Primary Examiner*—Richard Hjerpe
*Assistant Examiner*—Andrew Schnirel
(74) *Attorney, Agent, or Firm*—Brinks Hofer Gilson & Lione

(57) ABSTRACT

An input device capable of easily achieving a high performance is provided. The input device includes an input unit in which an input detecting unit of an electrostatic sensor is disposed on an input portion and an illumination unit in which an illumination portion is disposed on a rear surface of the input portion of the input unit. The input detecting unit of the electrostatic sensor is formed such that it can perform instruction display by illuminating light from the illumination unit.

13 Claims, 13 Drawing Sheets

INPUT DEVICE

BACKGROUND OF THE INVENTION

1. Field of the Invention

The present invention relates to an input device which performs input operation of operation information by using an electrostatic sensor. More particularly, the present invention relates to an input device suitable for improving visibility of an input operation unit by means of an instruction display and an illumination unit.

2. Description of the Related Art

Generally, an input device includes an input unit having an electrostatic sensor that performs a switching operation by detecting a change of a capacitance, and it is used for an input device in which an operator performs input operation of various information, such as figures, characters, or the like, in various electronic apparatuses, such as cellular phones, personal digital assistants (PDAs), or the like.

In such an input device, input detecting units of a plurality of electrostatic sensors, that is, electrodes are disposed on an input operation unit (input operation surface) which is formed in a casing of an electronic apparatus. In addition, according to a structure of the input device, when an input operation body composed of a conductive body, for example, a fingertip of the operator or a stylus approaches or comes in contact with portions opposite to these electrodes, a capacitance of the corresponding electrode varies, an output signal according to the variation is obtained, and input operation is performed (for example, see JP-A-2004-201175).

Further, in an input operation unit of an electronic apparatus, for example, a cellular phone, an illumination unit (key backlight) is disposed on a rear surface of an operation unit having an operation key, and an instruction display, each serves as a functional key and displays figures, characters, symbols, or the like, is provided on a surface of an operation key which is made of a transmitting material. As a result, an operation portion can be recognized easily at the time of operation (for example, see JP-A-2003-308752).

In the meantime, in recent years, various devices are required to have high performance. As a result, an input device which is an example of the various devices, should also have a high performance.

In an input device which uses an electrostatic sensor as an input operation unit, instruction display, which can be recognized by an illumination unit, should be provided on an input detecting unit of the electrostatic sensor by means of a printing method using a key top. As a result, the number of component is increased, causing the size of the device to increase. Therefore, it is not possible to achieve a device having a small size, a small thickness, and a low cost which is the general trend in recent years.

Further, in the conventional input device, since patterns of the instruction display are discriminated by shielding light illuminated from the illumination unit or transmitting it, when an area of the input operation unit is small, such as in an input operation unit of a cellular phone or a personal digital assistant, the number of the instruction display is small, and discrimination of an input function, that is, visibility of the instruction display may be deteriorated.

Furthermore, in an input operation unit of a recent input device, for example, a cellular phone, a personal digital assistant, or the like, as performances are improved, various operation, such as figure input, menu selection, mode switching, or the like, and it has been required that the diversity and visibility of the instruction display should be improved. In this case, the improvement of the visibility includes not only the improvement of the easy looking but also the improvement of the visibility or good looking of the instruction display in both of an ON state and an OFF state of the illumination.

SUMMARY OF THE INVENTION

The present invention has been finalized in view of the drawbacks inherent in the conventional input device, and it is an object of the present invention to provide an input device which is capable of easily achieving a high performance.

An input device according to an aspect of the invention includes: an input unit in which an input detecting unit of an electrostatic sensor is disposed on an input portion so as to perform input operation of information; and an illumination unit in which an illumination portion is disposed on a rear surface of the input portion of the input unit. Further, the input detecting unit of the electrostatic sensor is formed such that instruction display is performed by illumination from the illumination unit.

Preferably, the input detecting unit of the electrostatic sensor serves as a light shielding portion that shields the illumination from the illumination unit, and has a shape that is formed in a pattern used for the instruction display.

Preferably, the input detecting unit of the electrostatic sensor serves as a light shielding portion that shields the illumination from the illumination unit, and a light transmitting opening of a pattern used for the instruction display is formed in the input detecting unit.

Preferably, a cover panel is provided on a surface of the input portion of the input unit such that the instruction display is recognized in an ON state in which the illumination is made from the illumination unit and the instruction display is not recognized in an OFF state in which the illumination is not made from the illumination unit.

Preferably, the cover panel is a half mirror or a smoke panel.

An input device according to another aspect of the invention includes: an input unit in which an input detecting unit of an electrostatic sensor is disposed on an input portion so as to perform input operation of information; an illumination unit in which an illumination portion is disposed on a rear surface of the input portion of the input unit; and a cover panel that is disposed on a surface of the input portion of the input unit so as to perform first instruction display on the input detecting unit of the electrostatic sensor. Further, the input detecting unit of the electrostatic sensor is formed such that second instruction display is performed by illumination from the illumination unit, and the cover panel is provided on a surface of the input portion of the input unit such that both the first instruction display and the second instruction display are recognized in an ON state in which the illumination is made from the illumination unit and only the first instruction display is recognized in an OFF state in which the illumination is not made from the illumination unit.

Preferably, the input detecting unit of the electrostatic sensor serves as a light shielding portion that shields the illumination from the illumination unit, and has a shape that is formed in a pattern used for the second instruction display.

Preferably, the input detecting unit of the electrostatic sensor serves as a light shielding portion that shields the illumination from the illumination unit, and a light transmitting opening of a pattern used for the second instruction display is formed in the input detecting unit.

Preferably, the cover panel is a half mirror or a smoke panel, and the first instruction display is formed on a front surface or a rear surface of the half mirror or the smoke panel.

BRIEF DESCRIPTION OF THE DRAWINGS

FIG. 4 is a perspective view illustrating a display state of an instruction display in which an illumination unit of FIG. 1 is turned on;

FIG. 6 is a perspective view illustrating a display state of an instruction display in which an illumination unit of FIG. 5 is turned on;

FIG. 8 is a perspective view illustrating a display state of an instruction display which all illumination units of FIG. 7 are turned on;

FIG. 9 is a perspective view illustrating a display state of an instruction display in which a part of the illumination units of FIG. 7 is turned on;

FIG. 11 is a perspective view illustrating a display state of instruction display in which all of the illumination units of FIG. 10 are turned on;

FIG. 12 is a perspective view illustrating a display state of instruction display in which a part of the illumination units of FIG. 10 is turned on;

FIG. 14 is a perspective view illustrating a display state of instruction display in which all of the illumination units of FIG. 13 are turned on;

FIGS. 15A to 15C are plan views illustrating a display state of instruction display in which a part of the illumination units of FIG. 10 is turned on;

FIG. 17 is a perspective view illustrating a display state of an instruction display in which an illumination unit of FIG. 16 is turned on;

FIG. 20 is a perspective view illustrating a display state of an instruction display in which an illumination unit of FIG. 18 is turned on.

DESCRIPTION OF THE PREFERRED EMBODIMENT

Hereinafter, preferred embodiments of the invention will be described in detail with reference to the accompanying drawings.

Figure 1:
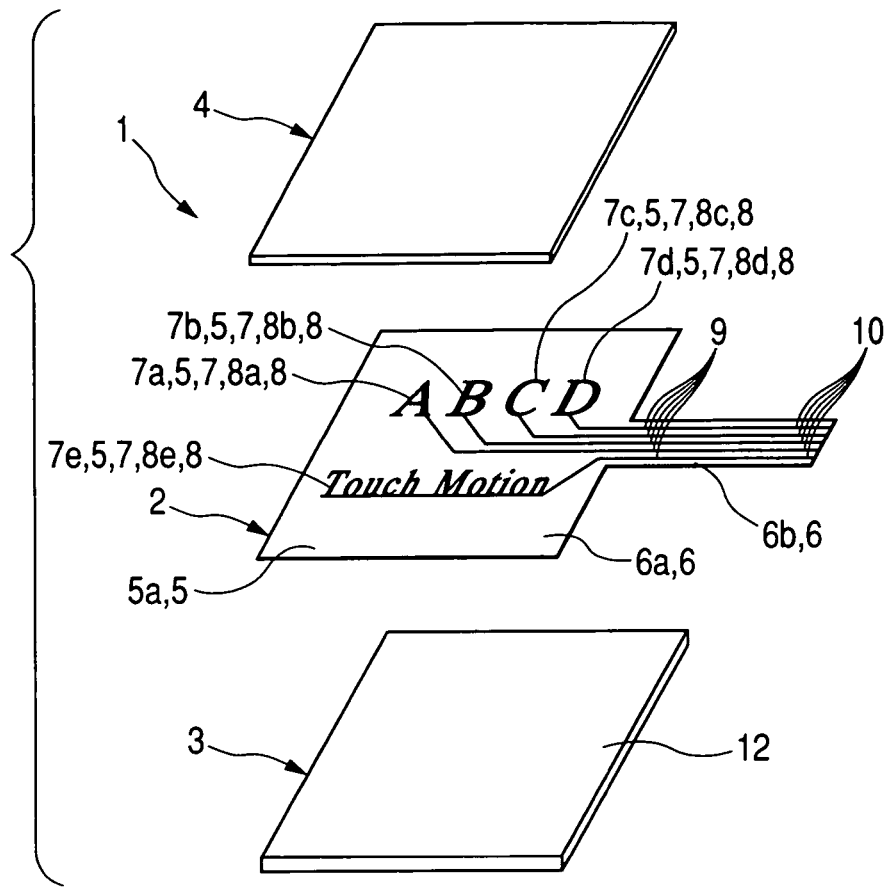
FIG. 1 is an exploded perspective view schematically illustrating a main portion of an input device according to a first embodiment of the invention.
Figure 2:
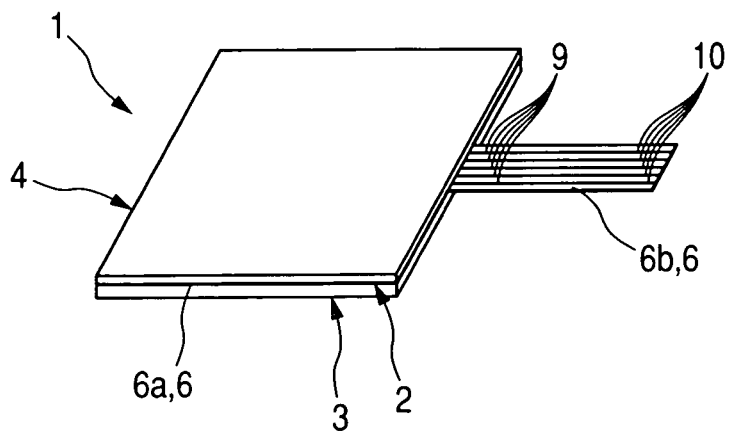
FIG. 2 is a perspective view illustrating a display state of an instruction display in which an illumination unit of FIG. 1 is turned off.
Figure 3:
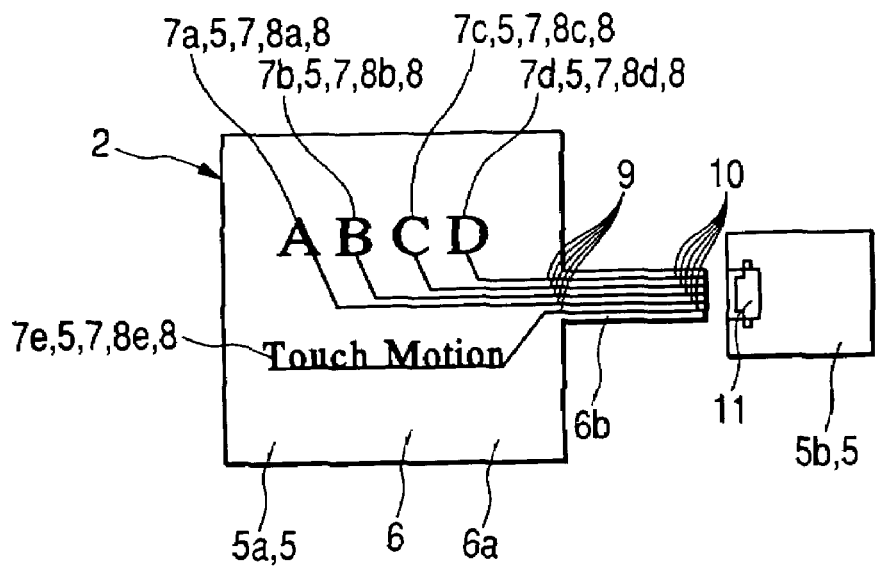
FIG. 3 is an enlarged plan view schematically illustrating a main portion of an input unit of FIG. 1.

FIGS. 1 to 3 are diagrams illustrating an input device according to a first embodiment of the invention. Specifically, FIG. 1 is an exploded perspective view schematically illustrating a main portion of the input device, FIG. 2 is a perspective view of FIG. 1, and FIG. 3 is an enlarged plan view schematically illustrating a main portion of an input unit.

As shown in FIGS. 1 and 2, the input device 1 according to the first embodiment of the invention includes an input unit 2, an illumination unit 3, and a cover panel 4. The input unit 2, the illumination unit 3, and the cover panel 4 are mounted in an input operation unit of a case having a predetermined shape in accordance with a used object, as in a body case of an electronic apparatus or the like.

Generally, the input unit 2 is used for input operation of information. The input unit 2 according to the present embodiment has an electrostatic sensor 5. As shown in FIG. 3, the electrostatic sensor 5 has an input portion 5a that becomes an execution portion of an input operation of information, and a circuit substrate 5b. Further, the input portion 5a has a transparent substrate 6, and five electrodes each of which serves as an input detection unit formed on a surface of the transparent substrate 6.

The transparent substrate 6 is made of a transparent flexible film or a sheet material, such as polyimide, polyethilenterephtalatel, or the like, having an insulating property. The transparent substrate 6 has a body portion 6a that has a rectangular flat shape in plan view, and a connecting portion 6b that extends in a stripe shape from a right side of the body portion 6a. The five electrodes 7a are formed on the surface of the body portion 6a.

In the present embodiment, the respective electrodes 7 include four electrodes 7a, 7b, 7c, and 7d and one electrode 7e which are disposed in two stages in a vertical direction. The four electrodes 7a, 7b, 7c, and 7d are formed in accordance with character shapes of 'A', 'B', 'C', and 'D' which become patterns of the five instruction displays 8.

Specifically, the input device 1 according to the present embodiment is constructed such that instruction display of the total five kinds including instruction display 8a of a character 'A', instruction display 8b of a character 'B', instruction display 8c of a character 'C', instruction display 8d of a character 'D', and instruction display 8e of characters 'Touch Motion' (reference numeral generically indicates five instruction displays 8a, 8b, 8c, 8d, and 8e) can be performed.

In addition, the number of electrodes 7 and the shape thereof can be selected in accordance with the used object. That is, various shapes such as figures, symbols, pictorial symbols, or the like may be selected and only one electrode or a plurality of electrodes may be selected. Further, the transparent substrate 6 may have only one electrode 7.

As a material for forming the electrodes 7, a conductive layer is used which is made of a metallic material, such as copper, aluminum, or the like, and represents a metallic color. The electrodes 7 are formed on the transparent substrate 6 by means of a printing method, a thermal transfer method, a thin film forming method, and a photolithography method.

Accordingly, the electrode 7 serves as an input detecting unit of the electrostatic sensor 5 according to the present embodiment. The electrode 7 serves as a light shielding portion 14 (see FIG. 4) that shields light illuminated from the illumination unit 3, and it is formed in a pattern used for the instruction display 8.

In addition, the electrode 7 may be made of a light-shielding, conductive material which is capable of making the electrode have a function of performing the instruction display 8.

One end of a wiring line 9 is connected to each electrode 7, and the other end of the wiring line 9 is connected to a connection terminal 10 which is formed at a front end portion of the connecting portion 6b. In addition, the connection terminal 10 is inserted into a connector 11 provided in the circuit substrate 5b, so that the input portion 5a is electrically connected to the circuit substrate 5b.

In addition, preferably, the wiring line 9 is made of the same material as the electrode 7 in that the input unit 2 is easily formed. However, in this case, since the wiring line 9 also becomes the light shielding portion 14 that shields the light illuminated from the illumination unit 3, it may be formed thin such that it is difficult for the wiring line 9 to be seen or be used as a portion of the instruction display 8. In addition, the wiring line 9 is formed of a transparent electrode so as to transmit the light illuminated from the illumination unit 3.

Except for the connection terminal 10, the electrode 7 and the wiring line are covered with a counter substrate (not shown) having a uniform thickness in order to prevent them from being corroded or damaged. Similar to the transparent substrate 6, the counter substrate is made of a transparent flexible film or a sheet material, such as polyimide, polyethilenterephtalatel, or the like, having an insulating property.

That is, the electrostatic sensor 5 according to the present embodiment has a structure in which the electrode 7 serving as the input detecting unit is interposed between the transparent substrate 6 and the counter substrate.

The circuit substrate 5b is constructed such that it outputs a clock signal (serving as a drive wave) from a clock signal generating unit of a microcomputer having a CPU and a memory as one input signal of an AND circuit serving as an AND circuit. A delay unit is connected to the input side of the AND circuit. The delay unit has an electrostatic sensor 5 and a resistor connected in series to the clock signal generating unit. The delay unit is constructed such that when a delay signal, which is obtained by applying a delay of rising to the clock signal in accordance with an electrostatic capacitance that is detected when a human body (the fingertip or the like) approaches or touches an electrostatic sensor 5, is output as another input signal of an AND circuit. In addition, the output side of the AND circuit is connected to an analog switch which outputs the output of the AND circuit by switching it using the clock signal, and the output side of the analog switch is connected to a resistor and a capacitor which serve as a smoothing unit for smoothly the output of the analog switch to output it. In addition, the smoothing unit is connected to the AD converter provided in the microcomputer such that it outputs the signal to the AD converter.

For the electrostatic sensor 5, an active-type or passive-type electrostatic sensor may be used. However, the passive-type electrostatic sensor is preferably used in that the size of the input unit 2 can be easily decreased, a manufacturing method can be simplified, and the amount of driving power can be easily reduced.

The illumination unit 3 is used for illuminating the input portion 5a of the input unit 2 from the rear surface side, and has a light guiding plate 12 which serves as an illumination portion disposed on the rear surface of the body portion 6a of the transparent substrate 6. The illumination unit 3 is constructed such that it can illuminate light emitted from a light source, such as an LED (not shown) or the like, which is disposed on a side surface of the light guiding plate 12, from the top surface in a planar shape.

In addition, the illumination unit 3 may be any one of, for example, known illumination units which are used for a key backlight in an operation unit of the cellular phone, rear surface-side illumination of a liquid crystal display device, or the like. Therefore, the detailed description thereof will be omitted.

In addition, the illumination unit 3 is constructed such that it sustains an ON state of illumination when the electrostatic sensor 5 detects that an input operation body, for example, the fingertip approaches or touches the electrostatic sensor 5 or when the electrostatic sensor 5 is in an operation state, that is, in a power-ON state where the input operation can be performed.

The cover panel 4 makes the electrode 7 serving as the instruction display 8 visualized in a state in which the illumination is made from the illumination unit 3, and makes the electrode 7 serving as the instruction display 8 not visualized in a state in which the illumination unit 3 is not made from the illumination unit 3. In the present embodiment, for the cover panel 4, a half mirror or a smoke panel is used.

In addition, the cover panel 4 may be provided in accordance with the necessity of a design concept or the like.

Next, the operation of the present embodiment having the above-mentioned structure will be described.

Figure 4:
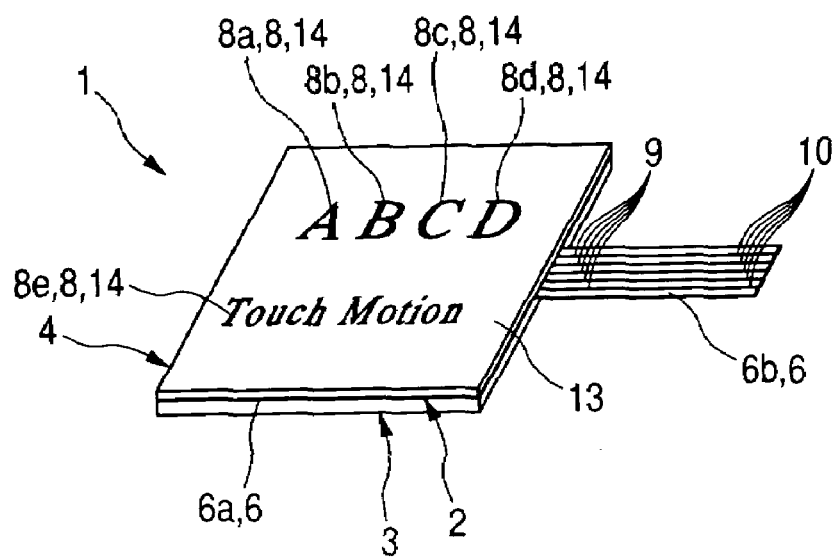

FIG. 4 is a diagram illustrating a display aspect of the instruction display when the illumination is in an ON state the input device according to the first embodiment of the invention, which is similar to FIG. 2.

According to the input device 1 of the present embodiment, it is possible to easily achieve a high performance of the device.

That is, according to the input device 1 of the present embodiment, as shown in FIG. 2, in an OFF state in which the illumination is not made from the illumination unit 3, there is nothing seen on the surface of the cover panel 4. In addition, in an ON state in which the illumination is made from the illumination unit 3, all of the electrodes 7 become light-shielding portions 14, and the other portion excluding the respective electrodes 7 becomes a transmitting region 13 which brightly shines, as shown in FIG. 4. Therefore, the five instruction displays 8a, 8b, 8c, 8d, and 8e, which are formed by the five electrodes 7a, 7b, 7c, 7d, and 7e, are visualized on the surface of the cover panel 4 so as to be clearly displayed.

That is, according to the input device 1 of the present embodiment, since the electrode 7 serving as the input detecting unit of the electrostatic sensor 5 becomes the light shielding portion 14 which shields the light illuminated from the illumination unit 3, it is possible to easily make the electrode 7 of the electrostatic sensor 5 become the instruction display 8 by means of the illuminating light from the illumination unit 3.

Accordingly, according to the input device 1 of the present embodiment, since the electrode 7 of the electrostatic sensor 5 can be made to function as the instruction display 8 (the electrode 7 and the instruction display 8 are the same component), the number of components can be reduced, as compared with a conventional structure in which the instruction display 8 is separately provided. In addition, since the number of components can be decreased, a thin, small-size and low-cost input device can be easily obtained.

Further, according to the input device 1 of the present embodiment, since the other portion excluding the respective electrodes 7 becomes a transmitting region 13 that illuminates brightly in an ON state of illumination, it is possible for an operator to easily discriminate portions of where the operator should perform the touching operation. Therefore, erroneous operation can be prevented.

That is, in an ON state of illumination, the operation switch (operation key), which exists in the electrode 7 functioning as the input detecting unit of the electrostatic sensor 5, is illuminated from the rear surface, it is possible for the operator to easily discriminate where the operation switch exists. As a result, it is possible to improve the visibility of the instruction display 8.

According to the input device 1 of the present embodiment, since the cover panel 4 is provided, the instruction display 8 can be surely visualized in an ON state in which the illumination is made from the illumination unit 3, and can be surely hidden in an OFF state in which the illumination is not made from the illumination unit 3. Therefore, it is possible to surely discriminate whether the instruction display 8 is made. As a result, it is possible to improve the operability, and a quality of the products' appearance, such as the visibility improvement like easy looking of the instruction display 8 in an ON state of illumination, and the external appearance or good looking of the instruction display 8 in both of an ON state and an OFF state of the illumination.

According to the input device 1 of the present embodiment, when the half mirror is used as the cover panel 4, since the color of the surface of the cover panel 4 can be made to be a metallic color, it is possible to apply luxury feeling of the input operation unit of the electronic apparatus.

According to the input device 1 of the present embodiment, when the smoke panel is used as the cover panel 4, since the color of the surface of the cover panel 4 can be controlled with a color of the smoke panel, it is possible to easily use various colors of the input operation unit of the electronic apparatus.

Accordingly, the half mirror or the smoke panel is used as the cover panel 4, so as to easily obtain a diverse range of electronic apparatuses.

Figure 5:
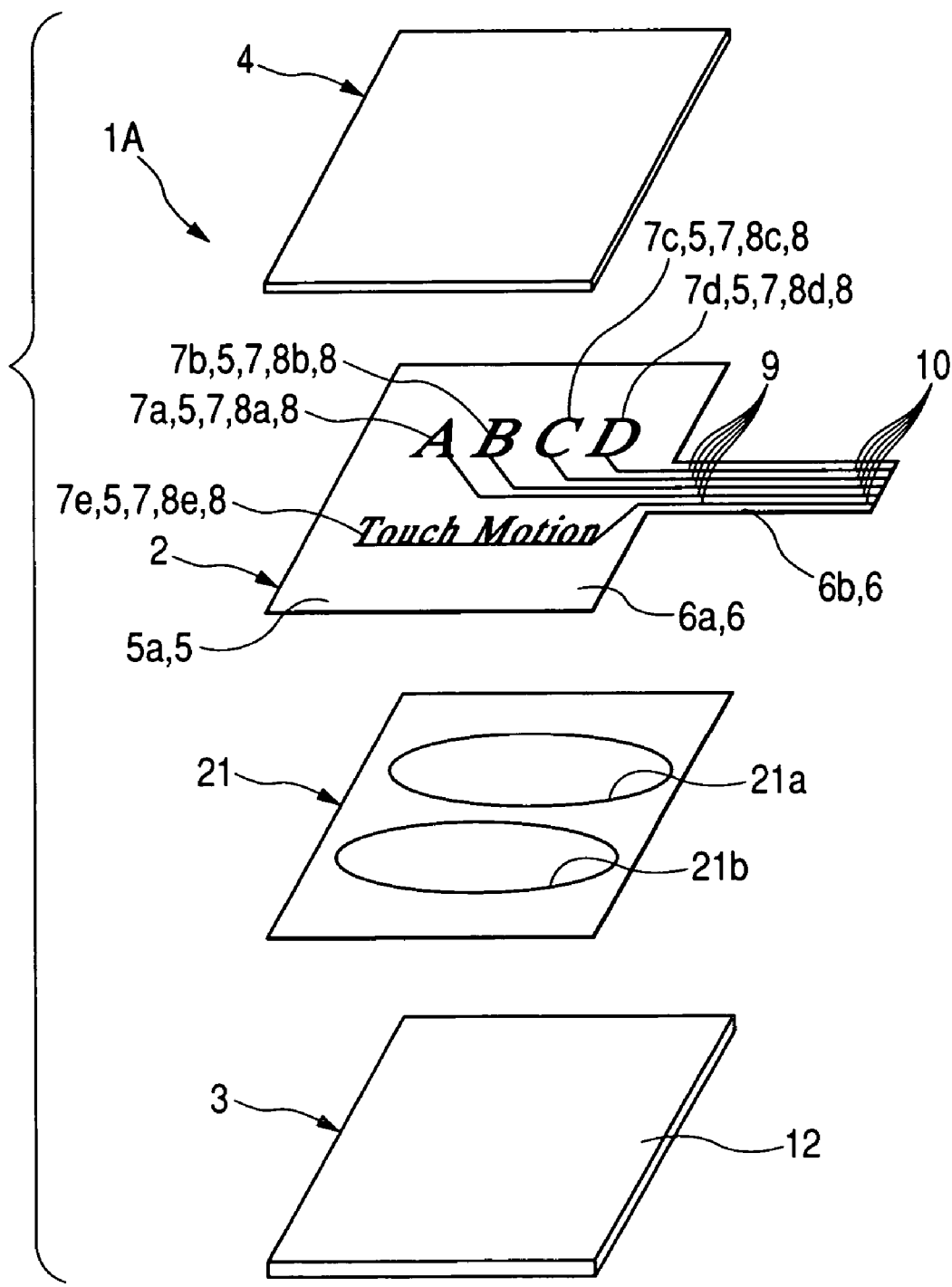
FIG. 5 is an exploded perspective view schematically illustrating a main portion of an input device according to a second embodiment of the invention.
Figure 6:
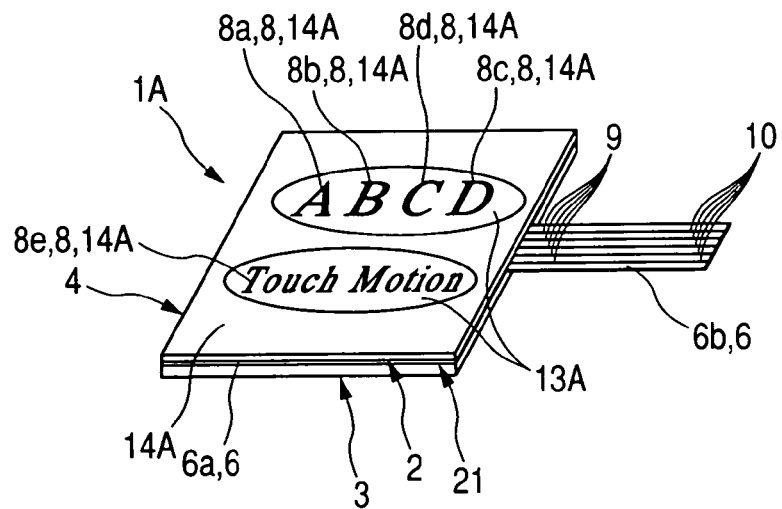

FIGS. 5 and 6 are diagrams illustrating an input device according to a second embodiment of the invention. Specifically, FIG. 5 is an exploded perspective view schematically illustrating a main portion of the input device, and FIG. 6 is a perspective view illustrating a display state of the instruction display in an ON state of illumination.

The input device 1A according to the second embodiment is an example of a structure in which a transmitting region 13, which is a portion brightly shining by the illumination, excluding the light shielding portions 14 composed of the electrodes 7 provided on the surface of the input device according to the first embodiment, is limited to a peripheral region of the instruction display 8.

That is, the input device 1A according to the present embodiment has an input unit 2, an illumination unit 3, and a light shielding plate that is disposed between the input unit 2 and the illumination unit 3 so as to obtain a desired transmitting region 13. In the light shielding plate 21, a first opening 21a and a second opening 21b having a laterally long elliptical shape, which are individually shown in the upper and lower sides of FIG. 5, are formed in two stages in a vertical direction. In this case, the first opening 21a is formed such that four electrodes 7a, 7b, 7c, and 7d, which are respectively formed in shapes of four characters including 'A', 'B', 'C', and 'D' becoming patterns of four instruction displays 8a, 8b, 8c, and 8d, can be collectively arranged in the first opening 21a.

In addition, the second opening 21b is formed such that the electrode 7e, which is formed in a shape of a character of 'Touch Motion' becoming a pattern of one instruction display 8e, can be arranged in the second opening 21b.

In addition, a shape of each of the first and second openings 21a and 21b may be selected from various shapes, such as a circular shape, an elliptical shape, a semicircular shape, a semi-elliptical shape, a triangular shape, a rectangular shape, a polygonal shape, a circular arc shape, or the like, in accordance with the necessity of a design concept or the like.

In addition, a size of each of the first and second openings 21a and 21b can set in accordance with the necessity of a design concept or the like.

For example, the first opening 21a shown in the upper side of FIG. 5 may be divided into four regions, and the four electrodes 7a, 7b, 7c, and 7d, which are respectively formed in accordance with shapes of characters including 'A', 'B', 'C', and 'D', may be respectively disposed in the four regions.

Further, instead of the light shielding plate 21, a light shielding film having a desired pattern may be provided on a surface of the input unit 2 opposite to the illumination unit 3 or a surface of the illumination unit 3 opposite to the input unit 2 by means of a printing method.

The other structure of the input device 1 according to the second embodiment is the same as that of the input device 1 according to the first embodiment. Therefore, constituent elements of a structure of the input device 1 according to the second embodiment, which are the same as or correspond to those of the input device 1 according to the first embodiment, are denoted by the same reference numerals, and the description thereof will be omitted.

According to the input device 1A according to the second embodiment having the above-mentioned structure, in an OFF state in which the illumination is not made from the illumination unit 3, similar to the input device 1 according to the first embodiment, there is nothing seen on the surface of the cover panel 4.

In addition, according to the input device 1A of the present embodiment, in which an ON state in which the illumination is made from the illumination unit 3, all of the electrodes 7 and the forming region of the light shielding plate 21 become the light shielding portion 14A. As shown in FIG. 6, all of the instruction displays 8, which are formed when the five electrodes 7 become the light shielding portion 14A in the two transmitting regions 13A, each of which has a laterally long elliptical shape and are formed in two stages in a vertical direction, are visualized on the surface of the cover panel 4 so as to be clearly displayed.

That is, on the surface of the cover panel 4, in the transmitting region 13A having a laterally long elliptical shape shown in the upper side of FIG. 6, the four instruction displays 8a, 8b, 8c, and 8d of 'A', 'B', 'C', and 'D' are visualized so as to be reflected, and in the transmitting region 13A having a laterally long elliptical shape shown in the lower side of FIG. 6, one instruction display 8e of a shape of a character 'Touch Motion' is visualized so as to be reflected.

Accordingly, according to the input device 1A of the second embodiment, it is possible to achieve the same effect as the input device 1 of the first embodiment, and the instruction display 8 can be more clearly reflected. As a result, it is possible to further improve the visibility.

Figure 7:
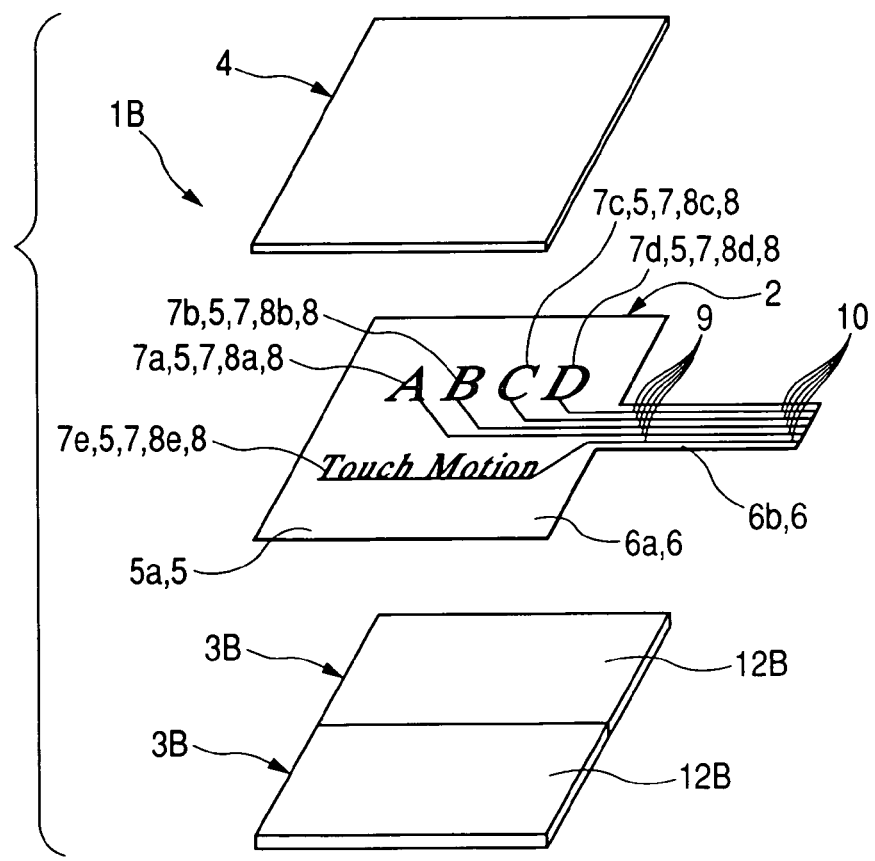
FIG. 7 is an exploded perspective view schematically illustrating a main portion of an input device according to a third embodiment of the invention.
Figure 8:
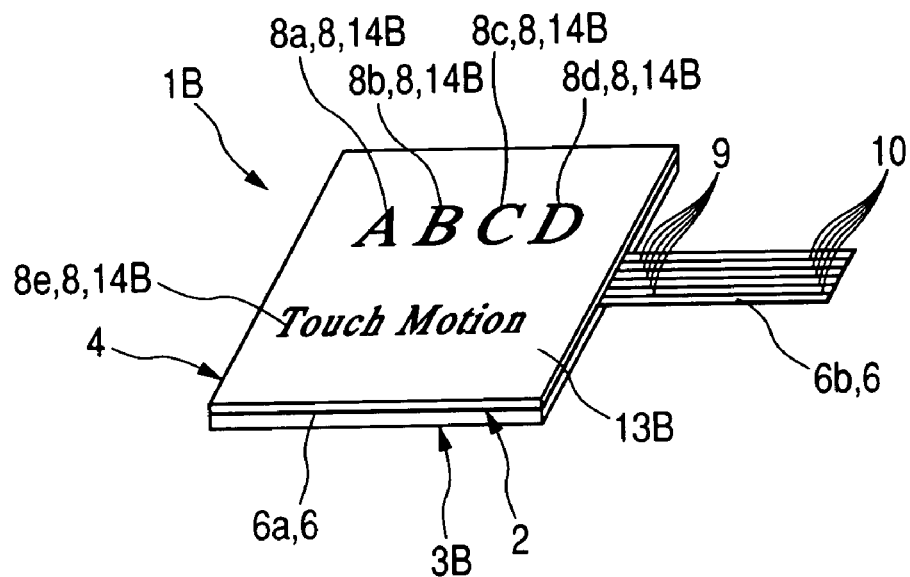
Figure 9:
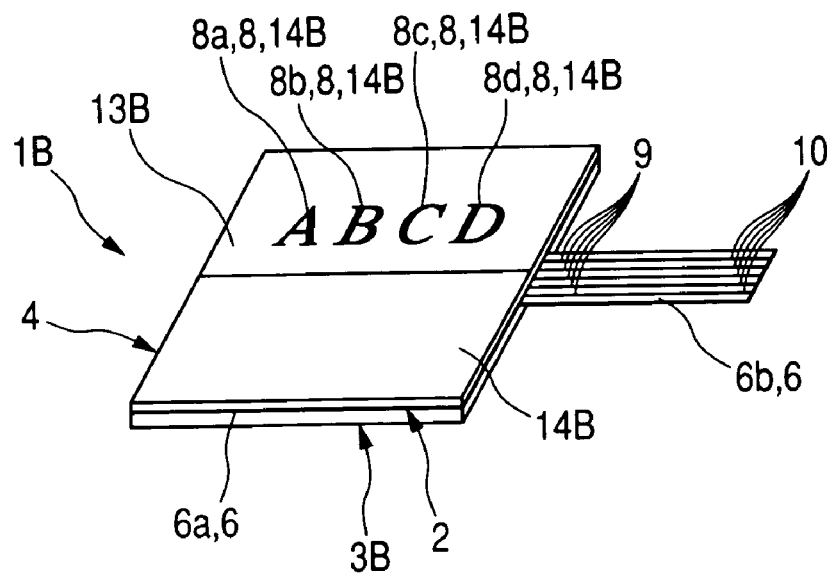

FIGS. 7 to 9 are diagrams illustrating an input device according to a third embodiment of the invention. Specifically, FIG. 7 is a diagram schematically illustrating a main portion of the input device, FIG. 8 is a perspective view illustrating a display state of an instruction display when all of the illumination units are turned on, and FIG. 9 is a perspective view illustrating a display state of the instruction display when a part of the illumination units is turned on.

In an input device 1B according to the third embodiment of the invention, the transmitting region 13 of the input device 1 according to the first embodiment is divided into a plurality of regions.

That is, in the input device 1B according to the present embodiment, as shown in FIG. 7, two illumination units 3B are provided, light guiding plates 12B of the respective illumination units 3B are disposed on the rear surface of the input unit 2 in two stages in a vertical direction, and transmitting regions 13B are formed in two stages in a vertical direction.

In addition, the illumination unit 3B may be provided for each electrode 7. That is, the transmitting region 13B may be individually provided for each instruction display 8.

In addition, colors of light beams emitted from the respective illumination units 3B may be different from each other.

The other structure of the input device 1B according to the third embodiment is the same as that of the input device 1 according to the first embodiment. Therefore, constituent elements of a structure of the input device 1B according to the third embodiment, which are the same as or correspond to those of the input device 1 according to the first embodiment, are denoted by the same reference numerals, and the description thereof will be omitted.

According to the input device 1B according to the third embodiment having the above-mentioned structure, in an OFF state in which the illumination is not made from the two illumination units 3B, similar to the input device 1 according to the first embodiment, there is nothing seen on the surface of the cover panel 4.

In addition, according to the input device 1B of the present embodiment, as shown in FIG. 8, in a state in which the illumination is made from the respective light guiding plates 12B of the two illumination units 3B, all of the instruction display 8 formed when all of the electrodes 7 become the light shielding portions 14B can be visualized on the surface of the cover panel 4 so as to be reflected.

Further, according to the input device 1B of the present embodiment, the instruction display 8, which is disposed in two stages in a vertical direction, can be displayed for each stage.

That is, in accordance with the position of the input operation body of the surface of the cover panel 4, the instruction display 8 disposed in two stages in a vertical direction can be selectively displayed.

For example, when the input operation body approaches or contacts any one of the four electrodes 7a, 7b, 7c, and 7d of the electrostatic sensor 5, the illumination unit 3B disposed in an upper stage of FIG. 7 can be turned on (a part of the illumination units is turned on). As a result, as shown in FIG. 9, the upper portion of the surface of the cover panel 4 serves as a transmitting region 13B which brightly illuminates, and the instruction displays 8a, 8b, 8c, and 8d, which are formed when the four electrodes 7a, 7b, 7c, and 7d, which are respectively formed in accordance with shapes of characters including 'A', 'B', 'C' and 'D', the light shielding portion 14B in the transmitting region 13B, are visualized on the surface of the cover panel 4 so as to be clearly displayed.

That is, in a state in which a power supply is turned on, the two illumination units 3B are turned off. In this state, when it is detected by the electrostatic sensor 5 that the input operation body, that is, the fingertip approaches or contacts any one of the four electrodes 7a, 7b, 7c, and 7d, the upper illumination unit 3B of the two illumination units 3B, which is located at the detection side, is turned on, and the four instruction displays 8a, 8b, 8c, and 8d, which are formed when the four electrodes 7a, 7b, 7c, and 7d located at the upper side of the illumination unit 3B of an ON state become the light shielding portion 14B, is visualized on the upper stage of the surface of the cover panel 4 so as to be clearly displayed.

At this time, the lower illumination unit 3B of the two illumination units 3B, which is located at a side opposite to the detection side, is turned off. Therefore, the lower portion of the surface of the cover panel 4 becomes a light shielding portion 14B.

In addition, when it is detected by the electrostatic sensor 5 that the input operation body, that is, the fingertip approaches or contacts the electrode 7e of the electrostatic sensor 5, the lower illumination unit 3B of the two illumination units 3B, which is located at the detection side, is turned on, and one instruction display 8e, which is formed by one electrode 7e located at the upper side of the illumination unit 3B of an ON state, is visualized on the surface of the cover panel 4 so as to be clearly displayed.

At this time, the upper illumination unit 3B of the two illumination units 3B, which is located to a side opposite to the detection side, is turned off. Therefore, the upper portion of the surface of the cover panel 4 becomes a light shielding portion 14B.

That is, the illumination unit 3B, which is opposite to the portion of the surface of the cover panel 4 in which the input operation body has approached or contacted, is turned off (a part of the illumination units is turned on), and a part of instruction display 8 disposed on the corresponding portion can be visualized on the surface of the cover panel 4.

That is, in a state in which a power supply is turned on, the two illumination units 3B are turned on. In this state, when it is detected by the electrostatic sensor 5 that the input operation body approaches or contacts any one of the electrodes 7, the illumination unit 3B of the two illumination units 3B, which is located at the side opposite to the detection side, may be turned off.

Accordingly, according to the input device 1B of the present embodiment, it is possible to achieve the same effect as the input device 1 of the first embodiment, and it is possible to further improve the visibility, selectivity, and diversity of the instruction display 8.

Figure 10:
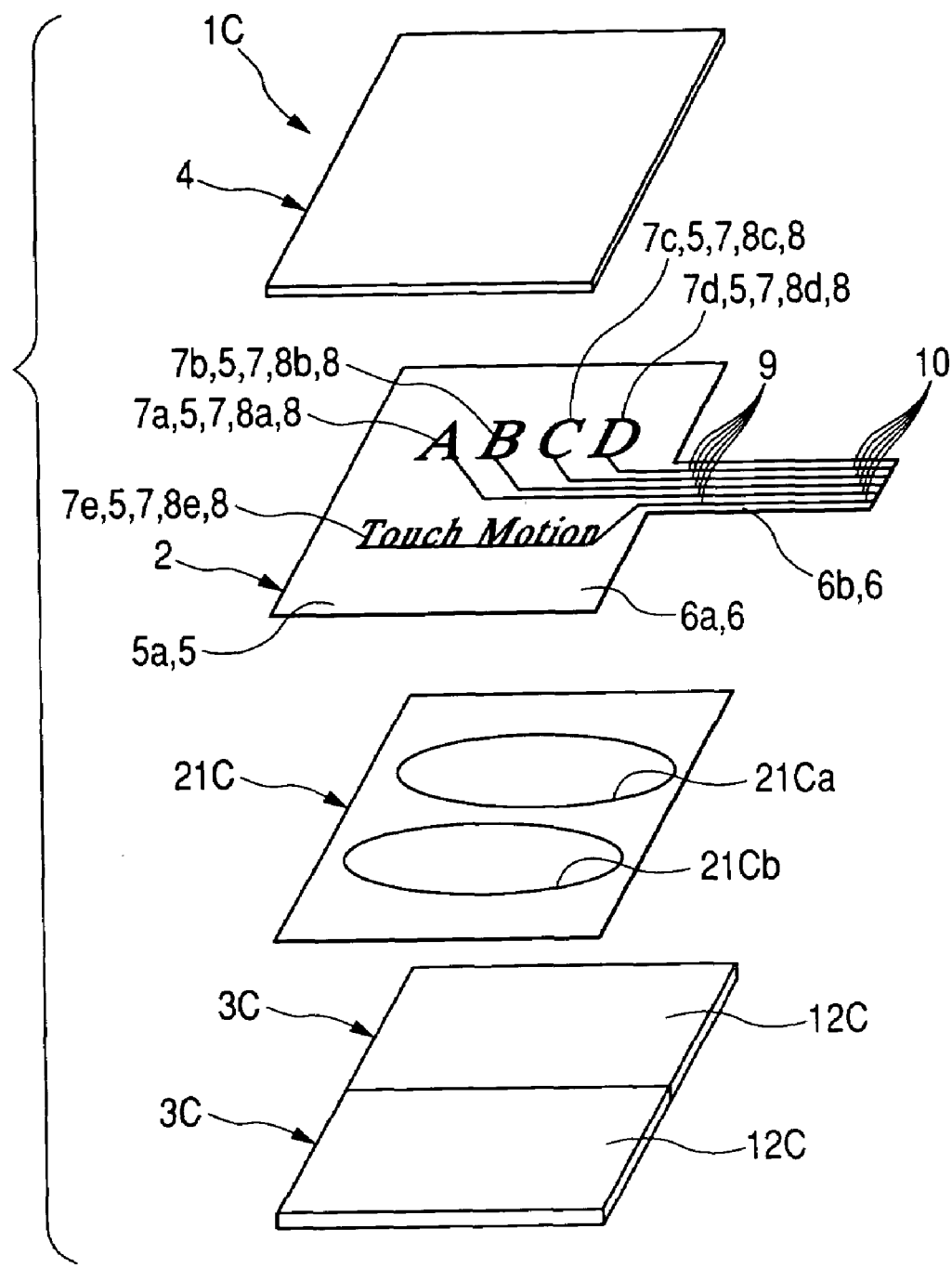
FIG. 10 is an exploded perspective view schematically illustrating a main portion of an input device according to a fourth embodiment of the invention.
Figure 11:
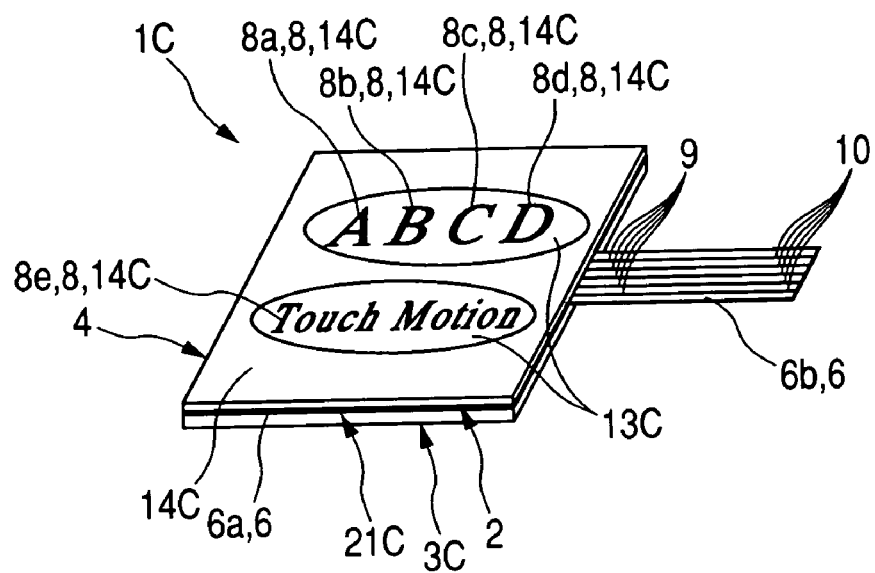
Figure 12:
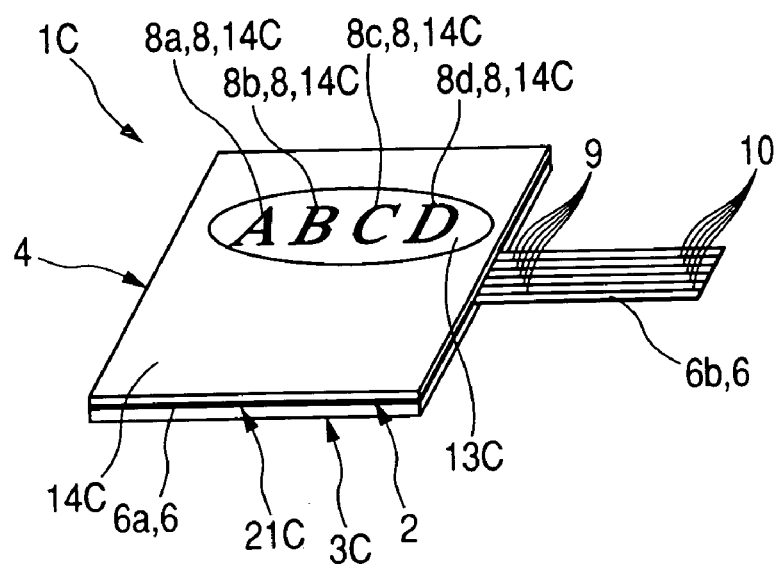

FIGS. 10 to 12 are diagrams illustrating an input device according to a fourth embodiment of the invention. Specifically, FIG. 10 is a diagram schematically illustrating a main portion of the input device, FIG. 11 is a perspective view illustrating a display state of the instruction display when all of the illumination units are turned on, and FIG. 12 is a perspective view illustrating a display state of the instruction display when a part of the illumination units is turned on.

An input device 1C according to the fourth embodiment of the invention is obtained by combining the input device 1A of the second embodiment and the input device 1B of the third embodiment with each other.

That is, in the input device 1C according to the present embodiment, in order to obtain a plurality of transmitting regions 13C, two illumination units 3C are provided in two stages in a vertical direction, and a light shielding plate 21C is disposed between the input unit 2 and the illumination unit 3C. In this case, the light shielding plate 21C has first and second openings 21Ca and 21Cb which have lateral elliptical shapes in order to obtain the transmitting region 13C limited to a peripheral region of the instruction display 8 and are formed in two stages in a vertical direction.

Further, instead of the light shielding plate 21C, a light shielding film having a desired pattern may be provided on a surface of the input unit 2 opposite to the illumination unit 3C or a surface of the illumination unit 3C opposite to the input unit 2 by means of a printing method.

The other structure of the input device 1C according to the fourth embodiment is the same as those of the input devices 1A and 1B according to the first and second embodiments. Therefore, constituent elements of a structure of the input device 1C according to the fourth embodiment, which are the same as or correspond to those of the input device 1 according to the input devices 1A and 1B according to the first and second embodiments, are denoted by the same reference numerals, and the description thereof will be omitted.

According to the input device 1C according to the fourth embodiment having the above-mentioned structure, in an OFF state in which the illumination is not made from the two illumination units 3C, similar to the input devices 1, 1A, and 1B according to the first to third embodiments, there is nothing seen on the surface of the cover panel of the input device 1C.

In addition, according to the input device 1C of the present embodiment, in a state in which the illumination is made from all of the illumination units 3C, that is, the illumination is made from the respective light guiding plates 12C of the two illumination units 3C, similar to a state in which the illumination is made from all of the illumination units in the input device 1A according to the second embodiment (FIG. 6), five electrodes 7 and the forming region of the light guiding plate 21C become a light shielding plate 14C. In addition, as shown in FIG. 11, all of the instruction displays 8 formed when the five electrodes 7 become the light shielding portion 14C in the two transmitting regions 13C with a laterally long elliptical shape can be visualized on the surface of the cover panel 4 so as to be reflected.

That is, on the surface of the cover panel 4, in the transmitting region 13C with a laterally long elliptical shape shown in the upper side of FIG. 11, the four instruction displays 8a, 8b, 8c, and 8d of 'A', 'B', 'C', and 'D' formed when the four electrodes 7a, 7b, 7c, and 7d become a light shielding portion 14B are visualized so as to be reflected, and in the transmitting region 13C having a laterally long elliptical shape shown in the lower side of FIG. 11, one instruction display 8e having a shape of a character 'Touch Motion' formed when one electrode 7e becomes a light shielding portion 14B is visualized so as to be reflected.

Further, according to input device 1C of the present embodiment, similar to the third embodiment, the instruction display 8, which is disposed in two stages in a vertical direction, can be displayed for each stage.

That is, in accordance with the position of the input operation body of the surface of the cover panel 4, the instruction display 8 disposed in two stages in a vertical direction can be selectively displayed.

For example, as shown in FIG. 12, the transmitting region 13C having a laterally long elliptical shape which brightly illuminates is formed at the upper portion of the surface of the cover panel 4 in which the input operation body has approached or contacted, and the instruction displays 8a, 8b, 8c, and 8d, which are formed when the four electrodes 7a, 7b, 7c, and 7d formed in shapes of characters of 'A', 'B', 'C', and 'D' become the light shielding portion 14C in the transmitting region 13C, are visualized on the surface of the cover panel 4 so as to be clearly displayed.

At this time, the lower illumination unit 3C of the two illumination units 3C, which is located at a side opposite to the detection side, is turned off. Therefore, the lower portion of the surface of the cover panel 4 becomes a light shielding portion 14C.

In addition, in an ON state in which the illumination is made from the light guiding plate 12C of the other illumination unit 3C of the two illumination units 3C, for example, the lower illumination unit 3C shown in FIG. 10 (an ON state in which a part of illumination is made), one transmitting region 13C having a laterally long elliptical shape is formed at a lower portion of the surface of the cover panel 4, and in the transmitting region 13C having a laterally long elliptical shape, one instruction display 8e having a shape of a character 'Touch Motion' formed when one electrode 7e becomes a light shielding portion 14C is visualized on the surface of the cover panel 4 so as to be reflected.

That is, the illumination unit 3C, which is located at the portion of the surface of the cover panel 4 in which the input operation body has approached or contacted, is turned on (a part of the illumination units is turned on), and a part of the instruction display 8 disposed on the corresponding portion can be visualized on the surface of the cover panel 4.

Accordingly, according to the input device 1C of the present embodiment, it is possible to achieve the same effect as the input devices 1A and 1B of the second and third embodiments.

Figure 13:
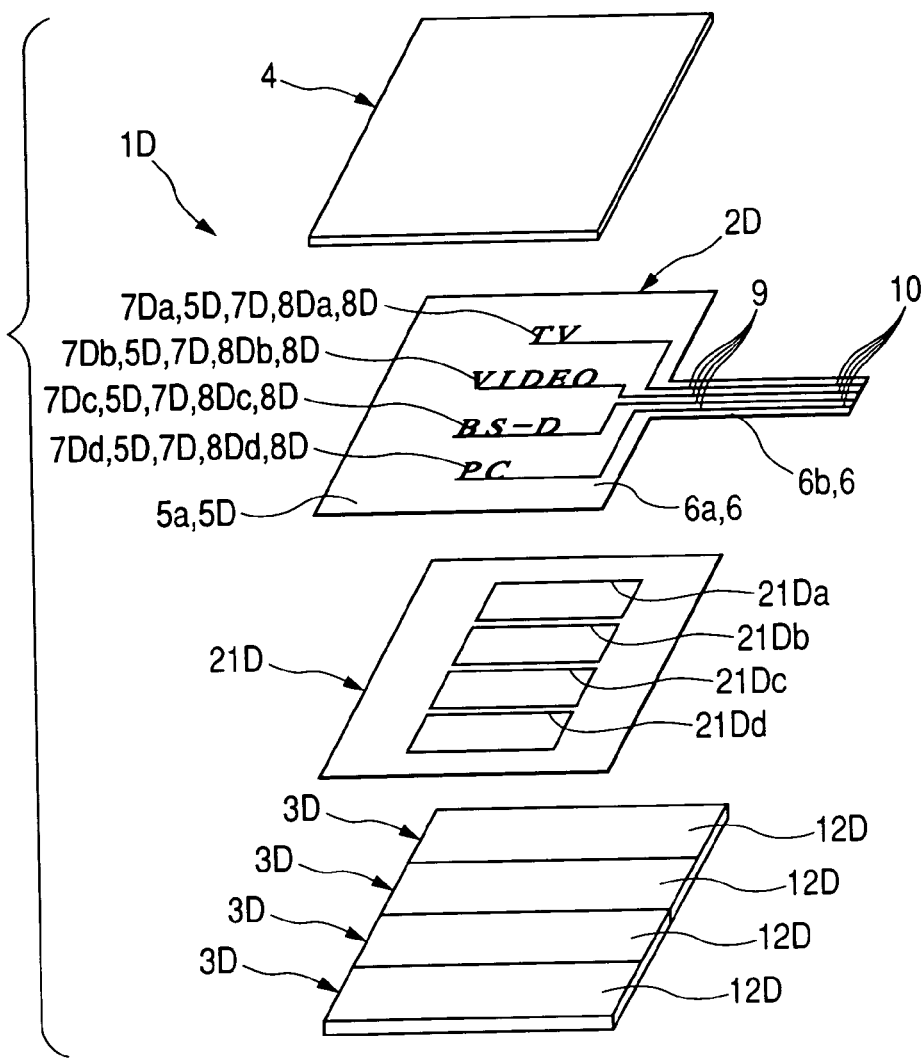
FIG. 13 is an exploded perspective view schematically illustrating a main portion of an input device according to a fifth embodiment of the invention.
Figure 14:
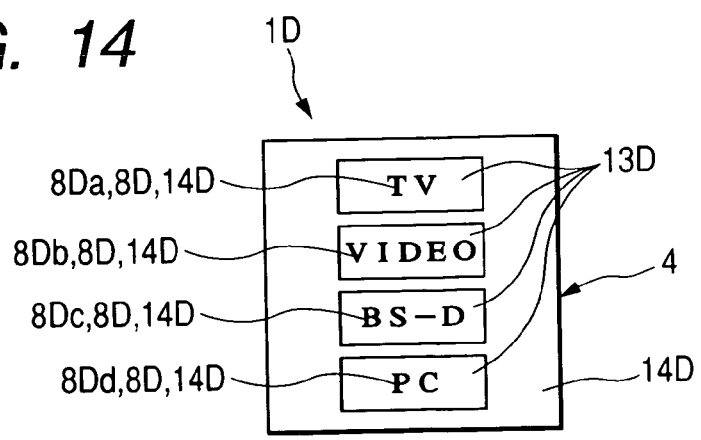

FIGS. 13 to 15 are diagrams illustrating an input device according to a fifth embodiment of the invention. FIG. 13 is an exploded perspective view schematically illustrating a main portion of the input device, FIG. 14 is a plan view illustrating a display state of the instruction display when all of illumination units are turned on, and FIG. 15 is a plan view illustrating a display state of the instruction display when a part of illumination units is turned on.

An input device 1D according to the fifth embodiment of the invention is a modification of the input device 1C according to the fourth embodiment of the invention.

That is, in the input device 1D according to the present embodiment, the electrostatic sensor 5D of the input unit 2D has four electrodes 7Da, 7Db, 7Dc, and 7Dd. These electrodes 7D (reference numeral 7D generically indicates the four electrodes 7Da, 7Db, 7Dc, and 7Dd) are formed in shapes of characters of 'TV', 'VIDEO', 'BS-D', and 'PC' (formed with one stroke) which becomes patterns of the four instruction displays 8Da, 8Db, 8Dc, and 8Dd. In addition, these electrodes 7D (reference numeral 7D generically indicates the four electrodes 7Da, 7Db, 7Dc, and 7Dd) are disposed in four stages in a vertical direction, and light guiding plates 12D of four illumination units 3D, which are disposed in four stages in a vertical direction, are disposed on rear surfaces of the respective electrodes 7D.

Accordingly, in the input device 1D according to the present embodiment, the illumination unit 3D is individually disposed for each electrode 7D.

In addition, all of the colors emitted from the respective illumination units 3D may be the same or may be different from each other or colors of the number smaller than the number of the illumination units 3D may be combined.

Further, a light shielding plate 21D is disposed between the input unit 2D and the illumination units 3D so as to obtain the four transmitting regions 13D. In the light shielding plate 21D, first, second, third, and fourth opening portions 21Da, 21Db, 21Dc, and 21Dd, which are sequentially shown in a vertical direction from the top side of FIG. 13 and each of which has a laterally long rectangular shape, are disposed in four stages in a vertical direction. In the first opening 21Da of the four openings, an electrode 7Da, which is formed in a shape of a character 'TV' becoming a pattern of the instruction display 8, can be disposed. In the second opening 21Db of the four openings, an electrode 7Db, which is formed in a shape of a character 'VIDEO' becoming a pattern of the instruction display 8, can be disposed. In the third opening 21Dc of the four openings, an electrode 7Dc, which is formed in a shape of a character 'BS-D' becoming a pattern of the instruction display 8, can be disposed. In the fourth opening 21Dd of the four openings, an electrode 7Dd, which is formed in a shape of a character 'PC' becoming a pattern of the instruction display 8, can be disposed.

The other structure of the input device 1D according to the fifth embodiment is the same as that of the input device 1 according to the first embodiment. Therefore, constituent elements of a structure of the input device 1D according to the fifth embodiment, which are the same as or correspond to those of the input device 1 according to the first embodiment, are denoted by the same reference numerals, and the description thereof will be omitted.

According to the input device 1D according to the third embodiment having the above-mentioned structure, it is possible to achieve the same effect as the input device 1C of the fourth embodiment, and it is possible to further improve the visibility, selectivity, and diversity of the instruction display 8D (reference numeral 8D generically indicates four instruction display 8Da, 8Db, 8Dc, and 8Dd).

That is, according to the input device 1D of the fifth embodiment, in an OFF state in which the illumination is not made from the respective illumination units 3D, similar to the input devices 1, 1A, 1B, and 1C according to the first to fourth embodiments, there is nothing seen on the surface of the cover panel 4 of the input device 1D.

In addition, according to the input device 1D of the present embodiment, in a state in which the illumination is made from all of the illumination units 3D, that is, the illumination is made from the respective light guiding plates 12D of the four illumination units 3D, four electrodes 7D and the forming region of the light guiding plate 21D become a light shielding plate 14D. In addition, as shown in FIG. 14, all of the instruction displays 8D formed when the four electrodes 7D become the light shielding portion 14C in the four transmitting regions 13D having a laterally long rectangular shapes can be visualized on the surface of the cover panel 4 so as to be clearly reflected.

That is, on the surface of the cover panel 4, the instruction display 8Da of 'TV' is visualized so as to be reflected in the transmitting region 13D having a laterally long rectangular shape shown in an uppermost stage of FIG. 14, the instruction display 8Db of 'VIDEO' is visualized so as to be reflected in the transmitting region 13D having a laterally long rectangular shape shown in a second stage of FIG. 14 in a downward direction, the instruction display 8Dc of 'BS-D' is visualized so as to be reflected in the transmitting region 13D with a laterally long rectangular shape shown in a third stage of FIG. 14 in a downward direction, and the instruction display 8Dd of 'PC' is visualized so as to be reflected in the transmitting region 13D having a laterally long rectangular shape shown in a lowermost stage of FIG. 14.

Figure 15A:
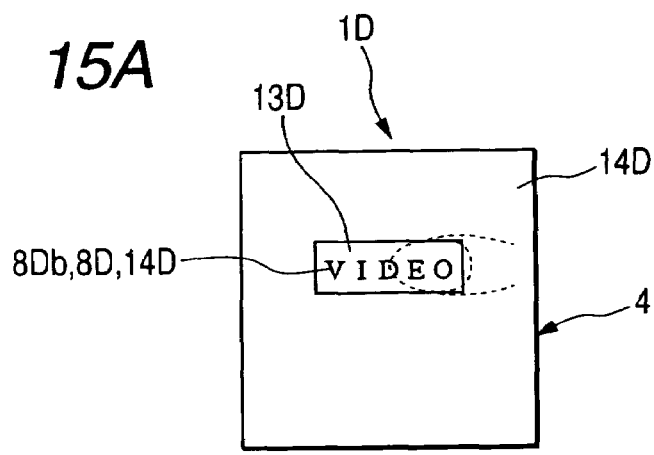

Further, according to the input device 1D of the present embodiment, similar to the input unit 1C of the fourth embodiment, when it is detected by the electrostatic sensor S that the operation input body has approached or contacted, the illumination unit 3D of the four illumination units 3D, which is located to the output side, is turned on, so that the instruction display 8D disposed in four stages in a vertical direction can be displayed for each stage. By adopting this structure, if the input operation body, for example, the fingertip of the operator approaches or contacts the surface of the cover panel 4, since the instruction display 8Db of, for example, 'VIDEO' disposed at the corresponding portion is brightly displayed, it is possible to easily determine what operation switch the operator contacts. As a result, when a plurality of operation switches are disposed at small intervals, since it is possible to clearly discriminate the operation switch in which the operator wants to press on, and not only the operation switch in which the operator wants to press on but also the operation switches around the corresponding operation switch can be prevented from being pressed. FIG. 15A illustrates a state in which only the instruction display 8D of 'VIDEO' is displayed.

At this time, all of the colors emitted from the respective illumination units 3D are different from each other, so that selectivity can be further improved.

Figure 15B:
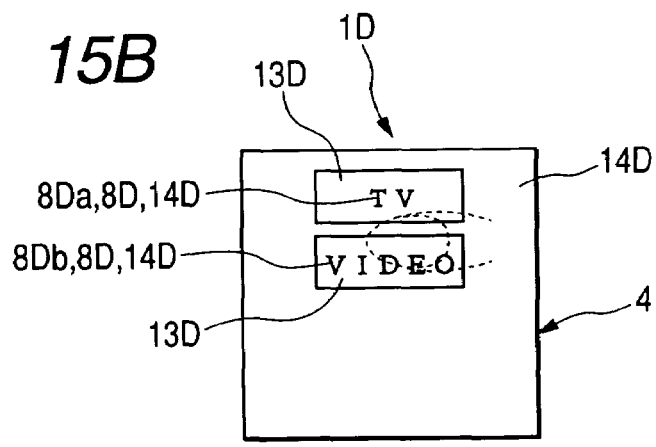

In addition, in a state in which the instruction display 8Db of 'VIDEO' is displayed, if the fingertip moves toward the upper side of FIG. 15A, the instruction display 8Da of 'TV' is displayed in a moving direction of the fingertip together with the instruction display 8Db of 'VIDEO'. At this time, the color of the instruction display 8Da of 'TV' may be different from the color of the instruction display 8Db of 'VIDEO'. This configuration may be achieved by disposing a plurality of colors of light sources, for example, light sources of two colors in one illumination unit 3D. FIG. 15B illustrates a state in which all of two kinds of instruction displays 8Da and 8Db are displayed.

Figure 15C:
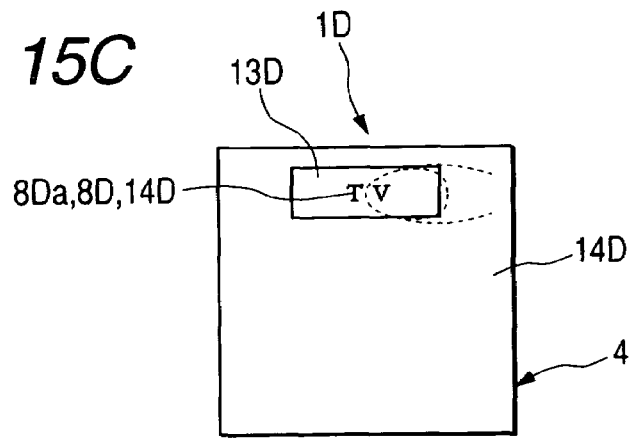

Then, while the fingertip reaches the instruction display 8Da of 'TV', the instruction display 8Db of 'VIDEO' disappears. At this time, the color of the instruction display 8Da of 'TV' may be changed to the same color as that when only the instruction display 8Db of 'VIDEO' is displayed. FIG. 15C illustrates a state in which the instruction display 8Db of 'VIDEO' disappears and only the instruction display 8Da of 'TV' is displayed.

After the instruction display 8Db of 'VIDEO' is displayed, the fingertip is separated from the instruction display 8Db of 'VIDEO'. Then, if the fingertip approaches or contacts the surface of the forming region of the instruction display 8Da of 'TV', the instruction display 8Da of 'TV' is displayed.

In addition, according to the input device 1D of the present embodiment, it may be applied to a method in which the location or color in which the instruction display 8D shines is changed for each function allocated to the operation switch (input mode of a device: for example, 'an active mode' and 'a standby mode' in a cellular phone), that is, the function is significantly changed.

Figure 16:
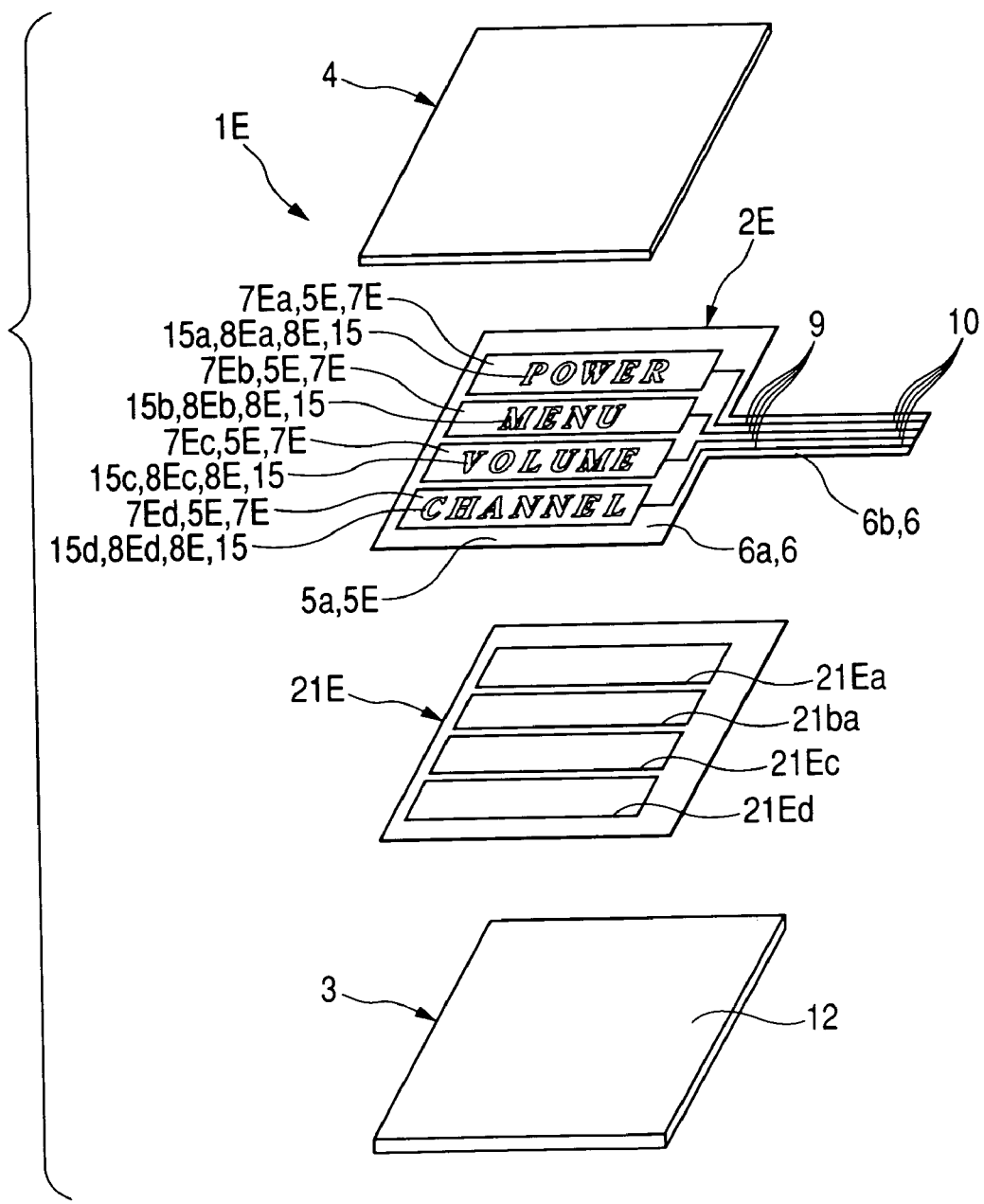
FIG. 16 is an exploded perspective view schematically illustrating a main portion of an input device according to a sixth embodiment of the invention.
Figure 17:
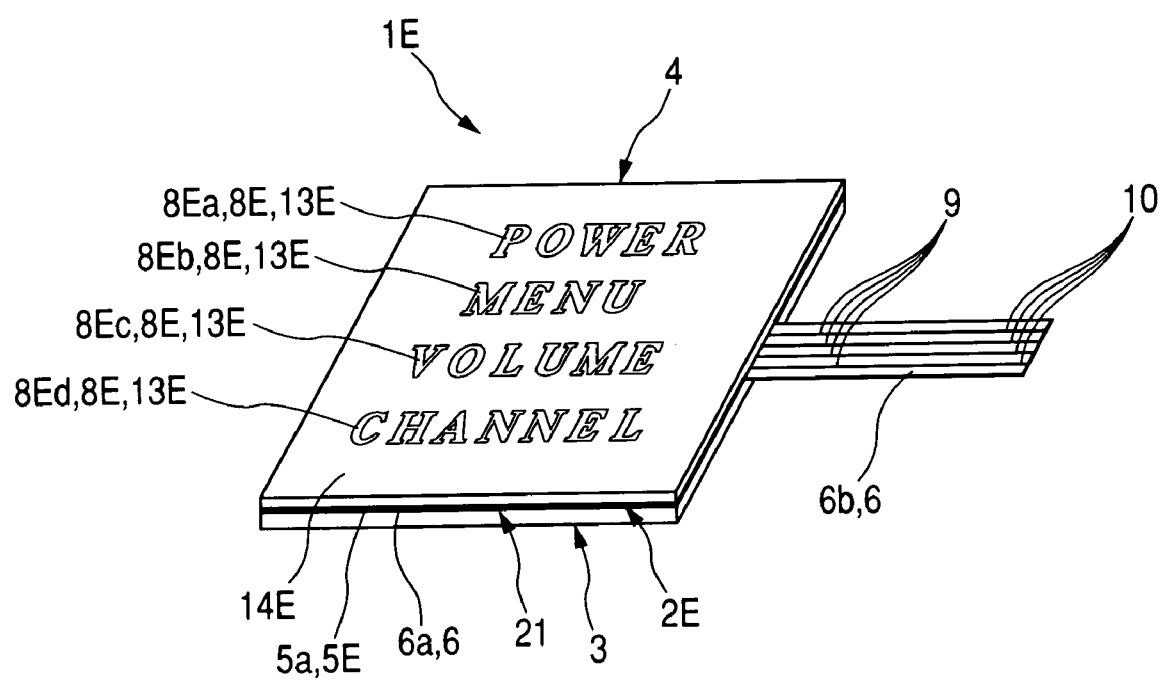

FIGS. 16 and 17 are diagrams illustrating an input device 1 according to a sixth embodiment of the invention. Specifically, FIG. 16 is an exploded perspective view schematically illustrating a main portion of the input device, and FIG. 17 is a perspective view illustrating a display state of instruction display in an ON state of illumination.

The input device 1E according to the present embodiment is a modification of the instruction display.

That is, in the input device 1E according to the present embodiment, as shown in FIG. 16, four electrodes 7E, which serve as an input detecting unit of the electrostatic sensor 5E constituting a part of the input unit 2E, becomes a light shielding portion 14E which shields light illuminated from the illumination unit 3. In the electrodes 7E, light transmitting openings 15 of patterns, which are used for the four instruction display 8E, are formed.

For example, as shown in FIG. 16, in the input device 2E, the four electrodes 7Ea, 7Eb, 7Ec, and 7Ed having a laterally long rectangular shapes, which serve as the input detecting unit of the electrostatic sensor SE, are disposed in four stages in a veretical direction. In addition, in the first electrode 7Ea shown in the uppermost stage of FIG. 16, a light transmitting portion 15a having a shape of a character 'POWER' is formed. Further, in the second electrode 7Eb which is adjacent to the first electrode 7Ea in a downward direction and provided in a second stage of FIG. 16 in a downward direction, a light transmitting portion 15b having a shape of a character 'MENU' is formed. Furthermore, in the third electrode 7Ec which is provided in a third stage of FIG. 16 in a downward direction, a light transmitting portion 15c having a shape of a character 'VOLUME' is formed, and in the fourth electrode 7Ed which is provided in the lowermost stage of FIG. 16, a light transmitting portion 15d having a shape of a character 'CHANNEL' is formed. In addition, the four instruction display 8Ea, 8Eb, 8Ec, and 8Ed are formed by these light transmitting openings 15a, 15b, 15c, and 15d.

In addition, a shape of each of the light transmitting openings 15 (reference numeral 15 generically indicates the four light transmitting openings 15a, 15b, 15c, and 15d) may be selected from various shapes, such as figures, symbols, pictorial symbols, or the like, in accordance with the used object.

In addition, the light shielding plate 21E is disposed between the input unit 2E and the illumination unit 3 so as to shield the outsides of the four electrodes 7E from the light. In the light shielding plate 21E, first, second, third, and fourth opening portions 21Ea, 21Eb, 21Ec, and 21Ed, which are sequentially shown in a vertical direction from the top side of FIG. 16 and each of which has a laterally long rectangular shape, are disposed in four stages in a vertical direction. In the first opening 21Ea of the four openings, an electrode 7Ea can be disposed. In the second opening 21Eb of the four openings, an electrode 7Eb can be disposed. In the third opening 21Ec of the four openings, an electrode 7Ec can be disposed. In the fourth opening 21Ed of the four openings, an electrode 7Ed can be disposed.

Further, instead of the light shielding plate 21E, similar to the input devices 1A, 1C, and 1D according to the above-mentioned second, fourth and fifth embodiments, a light shielding film having a desired pattern may be provided on a surface of the input unit 2E opposite to the illumination unit 3 or a surface of the illumination unit 3 opposite to the input unit 2E by means of a printing method. The light shielding plate 21E may be provided in accordance with the necessity of a design concept or the like.

Similar to the input devices 1B, 1C, and 1D according to the above-mentioned third, fourth, and fifth embodiments, the illumination unit 3 may be divided into a plurality of illumination units.

The other structure of the input device 1E according to the sixth embodiment is the same as that of the input device 1 according to the first embodiment. Therefore, constituent elements of a structure of the input device 1E according to the sixth embodiment, which are the same as or correspond to those of the input device 1 according to the first embodiment, are denoted by the same reference numerals, and the description thereof will be omitted.

According to the input device 1E according to the sixth embodiment having the above-mentioned structure, it is possible to achieve the same effect as the input device 1A according to the above-mentioned second embodiment.

That is, according to the input device 1E of the present embodiment, in an OFF state in which the illumination is not made from the illumination unit 3, similar to the input device 1 according to the above-mentioned first embodiment, there is nothing seen on the surface of the cover panel 4 of the input device 1E.

In addition, according to the input device 1E of the present embodiment, in an ON state in which the illumination is made from the illumination unit 3, the four electrodes 7E and the light shielding plate 21E become the light shielding portion 14E. As shown in FIG. 17, each of light transmitting openings 15 in the four electrodes 7E, that is, each of the four instruction displays 8E (reference numeral 8E generically indicates the four instruction display 8Ea, 8Eb, 8Ec, and 8Ed), which are formed in shapes of characters 'POWER', 'MENU', 'VOLUME', and 'CHANNEL', becomes a transmitting region 13E and brightly shines. Therefore, each instruction display 8E is visualized on the surface of the cover panel 4, that is, the surface of the input device 1E, so as to be clearly displayed.

That is, according to the input device 1E of the present embodiment, it is possible to easily achieve high performance.

In addition, according to the input device 1E of the present embodiment, the illumination unit 3 is divided into the plurality of illumination units, so that it is possible to achieve the same effect as the input device 1D of the above-mentioned fifth embodiment. In this case, a plurality of colors of light-emitting elements are provided in the plurality of illumination units 3, so that the respective instruction display 8 can be displayed with various colors, similar to the input device 1D of the above-mentioned fifth embodiment.

Figure 18:
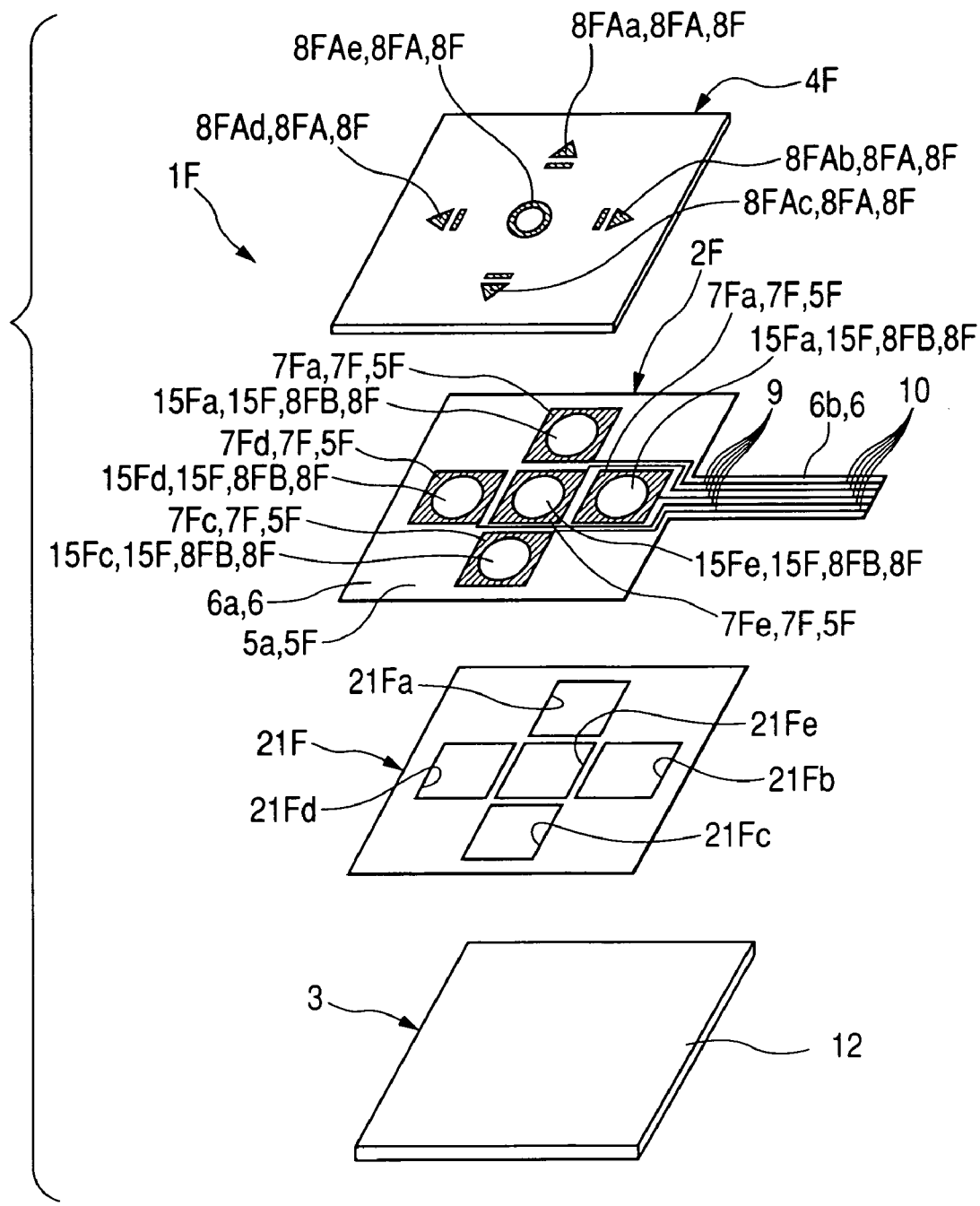
FIG. 18 is an exploded perspective view schematically illustrating a main portion of an input device according to a seventh embodiment of the invention.
Figure 19:
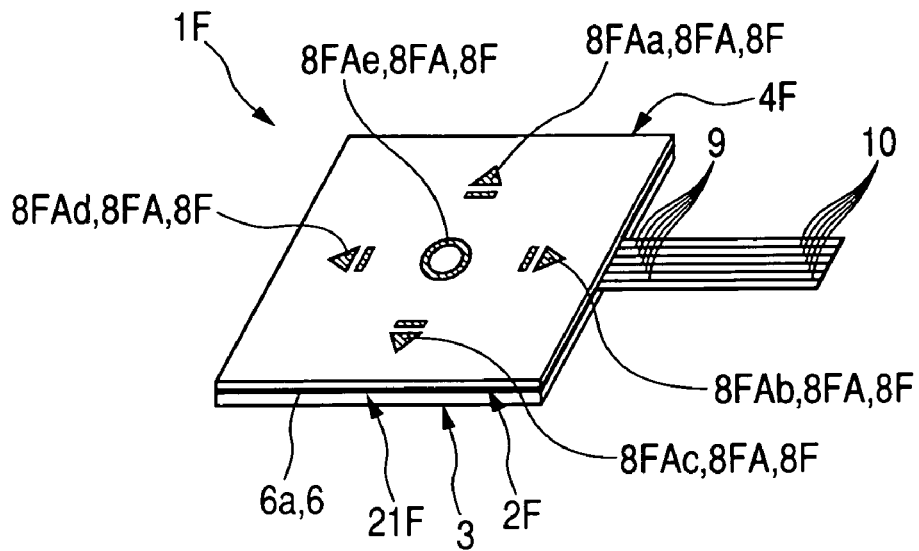
FIG. 19 is a perspective view illustrating a display state of an instruction display in which an illumination unit of FIG. 18 is turned off.
Figure 20:
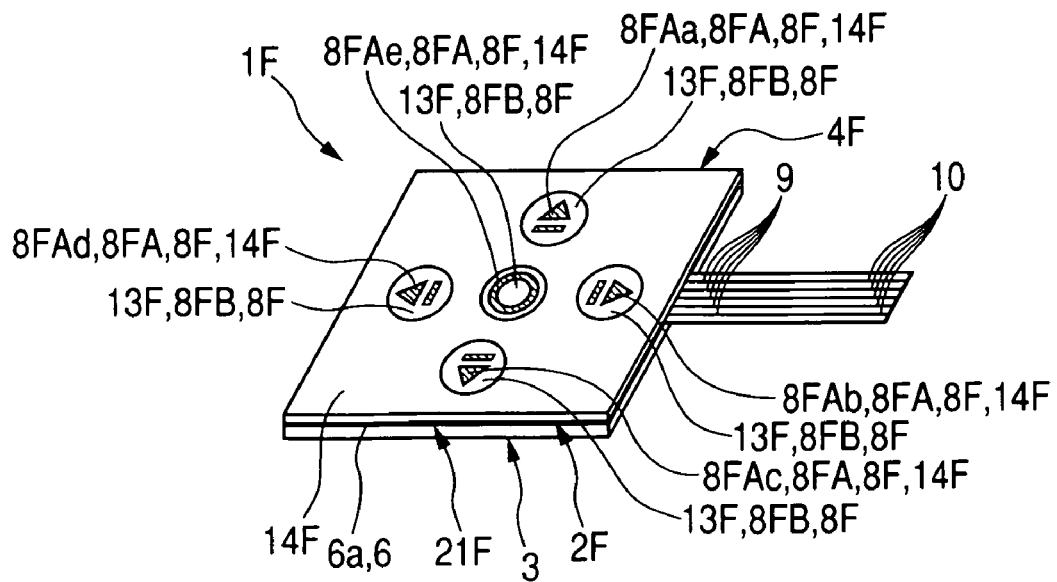

FIGS. 18 to 20 are diagrams illustrating an input device according to a seventh embodiment of the invention. Specifically, FIG. 18 is a diagram schematically illustrating a main portion of the input device, FIG. 19 is a perspective view illustrating a display state of instruction display when an illumination unit is turned off, and FIG. 20 is a perspective view illustrating a display state of instruction display when an illumination unit is turned on.

As shown in FIG. 18, the input device 1F according to the present embodiment has an input unit 2F in which second instruction display 8FB is provided, an illumination unit 3, and a cover panel 4F in which first instruction display 8FA is provided. By using the five electrodes 7F which serve as an input detecting unit of the electrostatic sensor 5F of the input unit 2F and has the same shape, the second instruction display 8FB is formed such that it can be displayed by the light illuminated from the illumination unit 3. In addition, the cover panel 4F is formed such that all of the first and second instruction displays 8FA and 8FB can be recognized in an ON state in which the illumination is made from the illumination unit 3 and only the first instruction display 8FA can be recognized in an OFF state in which the illumination is not made from the illumination unit 3.

That is, the input device 1F of the present embodiment has two kinds of instruction display 8F which includes the first and second instruction display 8FA and 8FB.

Further, in the input device 1F of the present embodiment, the five electrodes 7Fa, 7Fb, 7Fc, 7Fd, and F7e of patterns, which serve as an input detecting unit of the electrostatic sensor 5F and each of which has a rectangular shape, are disposed to form a cross shape. In addition, in the respective electrodes 7F (reference numeral 7F generically indicates the five electrodes 7Fa, 7Fb, 7Fc, 7Fd, and 7Fe), similar to the electrodes E of the input device 1E of the above-mentioned sixth embodiment, circular light transmitting openings 15Fa, 15Fb, 15Fc, 15Fd, and 15Fe, which form the second instruction display 8FB, are respectively formed.

In addition, a shape of each of the light transmitting openings 15F (reference numeral 15F generically indicates the five light transmitting openings 15Fa, 15Fb, 15Fc, 15Fd, and 15Fe) may be selectively used from various shapes, such as a character shape, a figure shape, a symbol shape, a pictorial shape, or the like.

In addition, for each electrode 7F, the light transmitting opening 15F is not provided. In addition, similar to the electrode 7 of the input device 1 according to the above-mentioned first embodiment, the electrode 7F may serve as a light shielding portion 14F, and the shape of the electrode 7F may be the same as the shape of the second instruction display 8FB. In this case, for the shape of the electrode 7F, one or a plurality of shapes may be selectively used from various shapes, such as figures, symbols, pictorial symbols, or the like, in accordance with the used object.

In addition, the cover panel 4F is formed such that all of the first and second instruction displays 8FA and 8FB can be recognized in an ON state in which the illumination is made from the light guiding plate 12 of the illumination unit 3 and only the first instruction display BFA can be recognized in an OFF state in which the illumination is not made from the light guiding plate 12 of the illumination unit 3. In the present embodiment, the half mirror or smoke panel is used. In addition, the five first instruction displays 8FA are formed at locations which become portions of the cover panel 4F opposite to the second instruction display 8FB, that is, the execution portions of the input operation of the information.

The five first instruction displays 8FA in the present embodiment is disposed such that the first instruction display 8FAa, the first instruction display 8FAb, the first instruction display 8FAc, and the first instruction display 8FAd form a cross shape as a whole on the basis of the first instruction display 8FAe having a ring shape. In this case, the first instruction display 8FAa has an upward triangle and a straight line which is disposed adjacent to a bottom side of the triangle, the first instruction display 8FAb has a rightward triangle and a straight line which is disposed adjacent to a left side of the triangle, the first instruction display 8FAc has a downward triangle and a straight line which is disposed adjacent to a top side of the triangle, and the first instruction display 8FAd has a leftward triangle and a straight line which is disposed adjacent to a right side of the triangle.

In addition, for a shape of each of the first instruction display 8FA, any one may be selectively used from various shapes, such as figures, symbols, pictorial shapes, or the like, in accordance with the used object.

Further, the first instruction display 8FA may be formed on at least one of the front surface or the rear surface of the cover panel 4F, by means of a printing method, a thermal transfer method, a thin film forming method, and a photolithography method.

Furthermore, the first instruction display 8FA is preferably formed on the rear surface side of the cover panel 4F which is opposite to the input unit 2F in that it is possible to prevent the first instruction display 8FA from being damaged due to the repeated contact of the human body on the first instruction display.

In addition, the light shielding plate 21F is disposed between the input unit 2F and the illumination unit 3 so as to shield the outsides of the five electrodes 7F from the light. In the light shielding plate 21F, a first opening 21Fa, a second opening 21Fb, a third opening 21Fc, a fourth opening 21Fd, and a fifth opening 21Fe, which are five rectangular electrodes and can dispose the respective electrodes 7F therein, are disposed so as to form a cross shape as a whole.

Further, instead of the light shielding plate 21F, similar to the input devices 1A, 1C, and 1D according to the above-mentioned second, fourth and fifth embodiments, a light shielding film having a desired pattern may be provided on a surface of the input unit 2F opposite to the illumination unit 3 or a surface of the illumination unit 3 opposite to the input unit 2F by means of a printing method. The light shielding plate 21F may be provided in accordance with the necessity of a design concept or the like.

Similar to the input devices 1B, 1C, and 1D according to the above-mentioned third, fourth, and fifth embodiments, the illumination unit 3 may be divided into a plurality of illumination units.

The other structure of the input device 1F according to the seventh embodiment is the same as that of the input device 1 according to the first embodiment. Therefore, constituent elements of a structure of the input device 1F according to the seventh embodiment, which are the same as or correspond to those of the input device 1 according to the first embodiment, are denoted by the same reference numerals, and the description thereof will be omitted.

According to the input device 1F according to the seventh embodiment having the above-mentioned structure, in an OFF state in which the illumination is not made from the illumination unit 3, as shown in FIG. 19, the five first instruction display 8FA are seen on the surface of the cover panel 4F.

In addition, according to the input device 1F of the present embodiment, in an ON state in which the illumination is made from the illumination unit 3, as shown in FIG. 20, the first instruction display 8FA, the light shielding plate 21F, and the electrodes 7F become the light shielding portions 14F. In the light transmitting opening 15F in each electrode 7F, that is, the transmitting region 13F composed of the second instruction display 8FB having the circular shape, the first instruction display 8FA becomes the light shielding portion 14F to be reflected. Therefore, the first instruction display 8FA and the second instruction display 8FB are visualized on the surface of the cover panel 4F, so that it is possible to more brightly reflect the instruction display 8F formed by both the first instruction display 8Fa and the second instruction display 8Fb.

Accordingly, according to the input device 1F of the present embodiment, in an ON state of illumination, since the peripheral portions of the first instruction display 8FA brightly shine, the instruction display 8FA formed on the cover panel 4F can be floated up. As a result, since the operator can easily discriminate the portion where the contacting operation is performed, operability can be improved, and erroneous operation can be prevented from occurring.

In addition, in the input device 1F of the present embodiment, a new display aspect that is not available in the conventional input device can be obtained by combining the first and second instruction displays 8Fa and 8Fb.

For example, the second instruction display 8FB is formed in the same manner as the electrode 7F of the first instruction display 8FA, and the first and second instruction displays 8Fa and 8Fb are formed in the same pattern. Therefore, the depth can be applied to the display. That is, it is possible to obtain the instruction display 8F having a three-dimensional effect.

In addition, in an ON state of illumination, the first instruction display 8FA overlaps the second instruction display 8FB or the second instruction display 8FB is displayed near the first instruction display 8FA, so that the new instruction display 8F different from the first instruction display 8FA can be visualized. As a result, it is possible to further improve the diversity and visibility of the instruction display 8F.

According to the input device 1F of the present embodiment, when the half mirror is used as the cover panel 4F, since the metallic color may be used as the color of the other portion of the surface excluding the first instruction display 8FA in an ON state of illumination, it is possible to apply luxury feeling to the input operation unit of the electronic apparatus. It goes without saying that the first instruction display 8FA can be displayed with a different metallic color.

According to the input device 1F of the present embodiment, when the smoke panel is used as the cover panel 4F, since the color of the other portion of the surface excluding the first instruction display 8FA in an OFF state of illumination can be controlled by the color of the smoke panel, it is possible to easily obtain a variation of color of the input operation unit of the electronic apparatus.

Accordingly, according to the input device 1F of the present embodiment, it is possible to easily achieve the high performance of the device.

In addition, according to the input device 1F of the present embodiment, by adopting the structure in which the illumination unit 3 is divided into the plurality of illumination units, it is possible to achieve the same effect as the input device 1D according to the above-mentioned fifth embodiment. In this case, a plurality of colors of light-emitting elements are provided in the plurality of illumination units 3, so that the respective instruction displays 8E can be displayed with various colors, similar to the input device 1D of the above-mentioned fifth embodiment.

The input device according to the above-mentioned embodiments may be used for an input device in which an operator performs input operation of various information, such as figures, characters, or the like, in various existing electronic apparatuses, such as a cellular phone, a personal digital assistant (PDA), or the like.

In addition, the invention is not limited to the above-mentioned embodiments, but various changes can be made in accordance with the necessity without departing fro the spirit and scope of the invention. According to the input device of the invention, since the instruction display can be integrally formed by the input detecting unit of the electrostatic sensor, it is possible to easily achieve the high performance of the device.

The invention claimed is:

1. An input device comprising:
   an input unit in which an input detecting unit of an electrostatic sensor is disposed on an input portion so as to perform input operation of information; and
   an illumination unit in which an illumination portion is disposed on a rear surface of the input portion of the input unit,
   wherein the input detecting unit of the electrostatic sensor is formed such that instruction display is performed by illumination from the illumination unit, and
   wherein the input detecting unit includes an electrode having a light shielding property where the shape of the electrode is formed to display at least one selected from the group consisting of characters, figures, symbols, and pictorial symbols.

2. The input device according to claim 1,
   wherein the electrode of the input detecting unit of the electrostatic sensor serves as a light shielding portion that shields the illumination from the illumination unit and has a shape that is formed in a pattern used for the instruction display.

3. The input device according to claim 1,
   wherein the electrode of the input detecting unit of the electrostatic sensor serves as a light shielding portion that shields the illumination from the illumination unit, and a light transmitting opening of a pattern used for the instruction display is formed in the input detecting unit.

4. The input device according to claim 1,
   wherein a cover panel is provided on a surface of the input portion of the input unit such that the instruction display is recognized in an ON state in which the illumination is made from the illumination unit and the instruction display is not recognized in an OFF state in which the illumination is not made from the illumination unit.

5. The input device according to claim 1,
   wherein the cover panel is a half mirror or a smoke panel.

6. An input device comprising:
   an input unit in which an input detecting unit of an electrostatic sensor is disposed on an input portion so as to perform input operation of information;
   an illumination unit in which an illumination portion is disposed on a rear surface of the input portion of the input unit; and
   a cover panel that is disposed on a surface of the input portion of the input unit so as to perform first instruction display on the input detecting unit of the electrostatic sensor,
   wherein the input detecting unit of the electrostatic sensor is formed such that second instruction display is performed by illumination from the illumination unit,
   wherein the input detecting unit includes an electrode having a light shielding property where the shape of the electrode is formed to display at least one selected from the group consisting of characters, figures, symbols, and pictorial symbols, and
   the cover panel is provided on the surface of the input portion of the input unit such that both the first instruction display and the second instruction display are recognized in an ON state in which the illumination is made from the illumination unit and only the first instruction display is recognized in an OFF state in which the illumination is not made from the illumination unit.

7. The input device according to claim 6,
   wherein the electrode of the input detecting unit of the electrostatic sensor functions as a light shielding portion that shields the illumination from the illumination unit, and has a shape that is formed in a pattern used for the second instruction display.

8. The input device according to claim 6,
   wherein the electrode of the input detecting unit of the electrostatic sensor serves as a light shielding portion that shields the illumination from the illumination unit, and a light transmitting opening of a pattern used for the second instruction display is formed in the input detecting unit.

9. The input device according to claim 6,
   wherein the cover panel is a half mirror or a smoke panel, and
   the first instruction display is formed on a front surface or a rear surface of the half mirror or the smoke panel.

10. The input device according to claim 1,
    wherein the illumination unit is provided for each instruction display performed.

11. The input device according to claim 6,
    wherein the illumination unit is provided for each instruction display performed.

12. The input device according to claim 1,
    wherein in an ON state, all illumination units are turned on, and
    wherein when the electrostatic sensor detects that an input operation body approaches or the input operation body is in contact with any one of the electrodes, the illumination unit disposed at a side not corresponding to the detected input operation body is turned off.

13. The input device according to claim 6,
    wherein in the ON state, all illumination units are turned on, and
    wherein when the electrostatic sensor detects that an input operation body approaches or the input operation body is in contact with any one of the electrodes, the illumination unit disposed at a side not corresponding to the detected input operation body is turned off.

* * * * *

UNITED STATES PATENT AND TRADEMARK OFFICE
CERTIFICATE OF CORRECTION

| | |
|---|---|
| PATENT NO. | : 7,595,791 B2 |
| APPLICATION NO. | : 11/372502 |
| DATED | : September 29, 2009 |
| INVENTOR(S) | : Takata et al. |

It is certified that error appears in the above-identified patent and that said Letters Patent is hereby corrected as shown below:

On the Title page,

[*] Notice: Subject to any disclaimer, the term of this patent is extended or adjusted under 35 USC 154(b) by 655 days Delete the phrase "by 655 days" and insert -- by 858 days --

Signed and Sealed this

Eleventh Day of May, 2010

David J. Kappos
*Director of the United States Patent and Trademark Office*